(12) United States Patent
Dunn et al.

(10) Patent No.: US 12,493,206 B1
(45) Date of Patent: Dec. 9, 2025

(54) DISPLAY ASSEMBLY WITH REPLACEABLE COVER

(71) Applicant: Manufacturing Resources International, Inc., Alpharetta, GA (US)

(72) Inventors: William Dunn, Alpharetta, GA (US); Mike Brown, Cumming, GA (US); Andrew Raygoza, Atlanta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 18/973,914

(22) Filed: Dec. 9, 2024

(51) Int. Cl.
*G02F 1/1333* (2006.01)
*H05K 5/03* (2006.01)
*H05K 7/20* (2006.01)

(52) U.S. Cl.
CPC .. *G02F 1/133331* (2021.01); *G02F 1/133325* (2021.01); *G02F 1/133328* (2021.01); *H05K 5/03* (2013.01); *H05K 7/20954* (2013.01)

(58) Field of Classification Search
None
See application file for complete search history.

(56) References Cited

U.S. PATENT DOCUMENTS

| | | |
|---|---|---|
| 2,029,221 A | 1/1936 | Burgess et al. |
| 2,678,860 A | 5/1954 | Peterson |
| 3,587,186 A | 6/1971 | Lane |
| 3,757,218 A | 9/1973 | Oliverio et al. |
| 3,984,931 A | 10/1976 | Belokin, Jr. |
| 4,169,327 A | 10/1979 | Stilling |
| 4,187,058 A | 2/1980 | Fish |
| 4,267,657 A | 5/1981 | Kloke |
| 4,327,513 A | 5/1982 | de Gunzburg |
| 4,452,000 A | 6/1984 | Gandy |
| 4,547,987 A | 10/1985 | Stilling |

(Continued)

FOREIGN PATENT DOCUMENTS

| | | |
|---|---|---|
| AU | 2015229457 B2 | 3/2019 |
| AU | 2019315350 B2 | 9/2022 |

(Continued)

OTHER PUBLICATIONS

The Free Dictionary, Bolt—Definition of bolt by The Free Dictionary, Jun. 15, 2016, 1 Page.

(Continued)

*Primary Examiner* — Shan Liu
(74) *Attorney, Agent, or Firm* — Standley Law Group LLP; Jeffrey S. Standley; Adam J. Smith (57) ABSTRACT

Display assemblies with replaceable covers are disclosed, along with related subassemblies, systems, and methods thereof. A cover subassembly for a display assembly includes a door frame, a plurality of clips, each removably installed to the door frame by fasteners, and a cover, a portion of which is sandwiched between a ledge of the door frame and a lip of each of the clips. The cover subassembly may be removed and replaced with a new cover subassembly. The cover of the removed cover subassembly may be replaced, such as at an offsite location, to generate a refurbished cover subassembly for subsequent installation to a same or different display assembly.

19 Claims, 7 Drawing Sheets

(56) References Cited

U.S. PATENT DOCUMENTS

| | | |
|---|---|---|
| 4,759,143 A | 7/1988 | Pomerleau |
| 4,792,881 A | 12/1988 | Wilson et al. |
| 4,817,317 A | 4/1989 | Kovalak, Jr. |
| 4,903,221 A | 2/1990 | Krenz |
| 4,903,423 A | 2/1990 | Hinca |
| 4,905,390 A | 3/1990 | Stilling |
| 5,025,355 A | 6/1991 | Harwood |
| 5,179,367 A | 1/1993 | Shimizu |
| 5,299,109 A | 3/1994 | Grondal |
| 5,423,142 A | 6/1995 | Douglas et al. |
| 5,457,905 A | 10/1995 | Kaplan |
| 5,493,802 A | 2/1996 | Simson |
| D373,120 S | 8/1996 | Andre et al. |
| 5,717,424 A | 2/1998 | Simson et al. |
| 5,755,050 A | 5/1998 | Aiken |
| 5,803,424 A | 9/1998 | Keehn et al. |
| 5,899,027 A | 5/1999 | St. Louis |
| D415,736 S | 10/1999 | Witte |
| 6,050,833 A | 4/2000 | Danzyger et al. |
| 6,172,869 B1 | 1/2001 | Hood, III et al. |
| 6,198,222 B1 | 3/2001 | Chang |
| 6,204,906 B1 | 3/2001 | Tannas, Jr. |
| 6,231,446 B1 | 5/2001 | Majima et al. |
| 6,380,999 B1 | 4/2002 | Tannas, Jr. |
| 6,405,463 B1 | 6/2002 | Roddy et al. |
| 6,427,284 B1 | 8/2002 | Harrelson, II et al. |
| 6,469,752 B1 | 10/2002 | Ishikawa et al. |
| D467,561 S | 12/2002 | Kosciolek |
| 6,494,429 B2 | 12/2002 | Tajima |
| 6,557,284 B2 | 5/2003 | Nolan |
| 6,639,571 B2 | 10/2003 | Wang |
| 6,748,685 B2 | 6/2004 | Peel |
| 6,758,002 B1 | 7/2004 | Duguay |
| 6,962,528 B2 | 11/2005 | Yokota |
| 6,976,330 B2 | 12/2005 | Milliken |
| 6,977,627 B1 | 12/2005 | Dalton |
| D530,686 S | 10/2006 | Reza |
| 7,210,839 B2 | 5/2007 | Jung et al. |
| D544,848 S | 6/2007 | Marz et al. |
| 7,226,176 B1 | 6/2007 | Huang |
| 7,292,435 B2 | 11/2007 | She |
| 7,339,782 B1 | 3/2008 | Landes et al. |
| 7,513,830 B2 | 4/2009 | Hajder et al. |
| 7,525,633 B2 | 4/2009 | Tannas, Jr. |
| 7,535,547 B2 | 5/2009 | Tannas, Jr. |
| D595,678 S | 7/2009 | Dunn |
| 7,589,958 B2 | 9/2009 | Smith |
| 7,591,508 B2 | 9/2009 | Chang |
| 7,601,067 B2 | 10/2009 | Anderson |
| 7,609,506 B2 | 10/2009 | Aguirre |
| D608,775 S | 1/2010 | Leung |
| 7,708,233 B2 | 5/2010 | Tannas, Jr. |
| 7,768,775 B2 | 8/2010 | Kim |
| 7,780,492 B2 | 8/2010 | Tannas, Jr. |
| D635,614 S | 4/2011 | Yan |
| 7,938,051 B2 | 5/2011 | Tannas |
| 7,965,039 B2 | 6/2011 | Watanabe et al. |
| 7,985,139 B2 | 7/2011 | Lind et al. |
| 8,006,435 B2 | 8/2011 | DeBlonk et al. |
| 8,016,452 B2 | 9/2011 | Dunn |
| 8,116,081 B2 | 2/2012 | Crick, Jr. |
| D657,421 S | 4/2012 | Yan |
| D657,422 S | 4/2012 | Yan |
| D669,938 S | 10/2012 | Lard et al. |
| 8,335,089 B2 | 12/2012 | Takahashi et al. |
| 8,418,387 B2 | 4/2013 | Swatt et al. |
| 8,537,302 B2 | 9/2013 | Dunn |
| D704,265 S | 5/2014 | Yan |
| 8,919,778 B2 | 12/2014 | Fodera |
| 9,061,597 B2 | 6/2015 | Oda et al. |
| 9,235,232 B2 | 1/2016 | King |
| 9,282,676 B1 | 3/2016 | Diaz |
| 9,313,447 B2 | 4/2016 | Dunn et al. |
| 9,317,060 B2 | 4/2016 | Dunn et al. |
| 9,655,289 B2 | 5/2017 | Dunn et al. |
| 9,703,320 B2 | 7/2017 | Bowers et al. |
| 9,756,739 B2 | 9/2017 | Russell-Clarke et al. |
| 9,823,690 B2 | 11/2017 | Bowers et al. |
| 9,857,618 B2 | 1/2018 | Barnes |
| 9,943,017 B2 | 4/2018 | Bouissiere et al. |
| 10,120,419 B2 | 11/2018 | Tatsuta |
| 10,143,106 B2 | 11/2018 | Diaz |
| 10,194,564 B2 | 1/2019 | Dunn et al. |
| 10,212,845 B2 | 2/2019 | Dunn et al. |
| 10,398,058 B2 | 8/2019 | Diaz |
| 10,401,016 B2 | 9/2019 | Coo |
| 10,559,965 B2 | 2/2020 | Dunn et al. |
| 10,602,626 B2 | 3/2020 | Dunn |
| 10,716,224 B2 | 7/2020 | Dunn et al. |
| 10,827,644 B2 | 11/2020 | Diaz |
| 10,844,995 B1 | 11/2020 | Wang et al. |
| 10,925,174 B2 | 2/2021 | Dunn et al. |
| 10,999,941 B2 | 5/2021 | Dunn |
| 11,117,482 B2 | 9/2021 | Mercer et al. |
| 11,336,101 B2 | 5/2022 | Hao et al. |
| 11,778,757 B2 | 10/2023 | Dunn et al. |
| 11,822,171 B2 | 11/2023 | Dunn et al. |
| 11,919,393 B2 | 3/2024 | Dunn et al. |
| 11,934,054 B2 | 3/2024 | Dunn et al. |
| 11,997,808 B2 | 5/2024 | Dunn et al. |
| D1,029,778 S | 6/2024 | Dunn et al. |
| D1,029,939 S | 6/2024 | Dunn et al. |
| D1,029,940 S | 6/2024 | Dunn et al. |
| D1,030,691 S | 6/2024 | Dunn et al. |
| D1,030,873 S | 6/2024 | Dunn et al. |
| D1,030,888 S | 6/2024 | Dunn et al. |
| 12,004,310 B2 | 6/2024 | Dunn et al. |
| 12,022,624 B2 | 6/2024 | Dunn et al. |
| 12,039,894 B2 | 7/2024 | Dunn et al. |
| 12,072,561 B2 | 8/2024 | Dunn et al. |
| 2001/0032404 A1 | 10/2001 | Hillstrom |
| 2001/0043290 A1 | 11/2001 | Yamamoto |
| 2001/0043293 A1 | 11/2001 | Inoue |
| 2002/0009978 A1 | 1/2002 | Dukach et al. |
| 2002/0149714 A1 | 10/2002 | Anderson et al. |
| 2003/0039094 A1 | 2/2003 | Sarkinen et al. |
| 2004/0025389 A1 | 2/2004 | Peterson |
| 2004/0103570 A1 | 6/2004 | Ruttenberg |
| 2004/0212548 A1 | 10/2004 | Ruttenberg |
| 2004/0257492 A1 | 12/2004 | Mai et al. |
| 2005/0105178 A1 | 5/2005 | Kim |
| 2005/0127796 A1 | 6/2005 | Olesen et al. |
| 2005/0141245 A1* | 6/2005 | Sugahara ........ G02F 1/133308 362/614 |
| 2006/0012985 A1 | 1/2006 | Archie, Jr. et al. |
| 2006/0060732 A1 | 3/2006 | Tannas, Jr. |
| 2006/0077636 A1 | 4/2006 | Kim |
| 2006/0081367 A1 | 4/2006 | Chiu et al. |
| 2006/0137294 A1 | 6/2006 | Waits et al. |
| 2006/0144987 A1 | 7/2006 | Clark |
| 2006/0215421 A1 | 9/2006 | Chang et al. |
| 2006/0218828 A1 | 10/2006 | Schrimpf et al. |
| 2007/0021217 A1 | 1/2007 | Wu |
| 2007/0070615 A1 | 3/2007 | Joslin et al. |
| 2007/0139574 A1 | 6/2007 | Ko et al. |
| 2007/0159035 A1 | 7/2007 | Mullen |
| 2007/0253205 A1 | 11/2007 | Welker |
| 2007/0267554 A1 | 11/2007 | Tannas, Jr. |
| 2008/0002350 A1 | 1/2008 | Farrugia |
| 2008/0054144 A1 | 3/2008 | Wohlford |
| 2008/0100186 A1 | 5/2008 | Li |
| 2008/0174456 A1 | 7/2008 | Warren |
| 2008/0236005 A1 | 10/2008 | Isayev et al. |
| 2008/0255901 A1 | 10/2008 | Carroll et al. |
| 2008/0276507 A1 | 11/2008 | Hines |
| 2008/0304219 A1 | 12/2008 | Chen |
| 2009/0009041 A1 | 1/2009 | Zeidler |
| 2009/0016004 A1 | 1/2009 | McCoy |
| 2009/0104989 A1 | 4/2009 | Williams et al. |
| 2009/0126906 A1 | 5/2009 | Dunn |
| 2009/0141199 A1 | 6/2009 | Fujikawa |
| 2009/0227167 A1 | 9/2009 | Tannas, Jr. |
| 2009/0231807 A1 | 9/2009 | Bouissiere |
| 2009/0241388 A1 | 10/2009 | Dunn |

(56) References Cited

U.S. PATENT DOCUMENTS

| | | |
|---|---|---|
| 2009/0241437 A1 | 10/2009 | Steinle et al. |
| 2009/0278007 A1 | 11/2009 | Taylor |
| 2009/0279240 A1 | 11/2009 | Karppanen |
| 2010/0171889 A1 | 7/2010 | Pantel et al. |
| 2010/0213323 A1 | 8/2010 | Tannas, Jr. |
| 2010/0220249 A1 | 9/2010 | Nakamichi et al. |
| 2010/0226091 A1 | 9/2010 | Dunn |
| 2010/0297907 A1 | 11/2010 | Tannas, Jr. |
| 2011/0019348 A1 | 1/2011 | Kludt et al. |
| 2011/0090630 A1 | 4/2011 | Bergeron et al. |
| 2011/0114384 A1 | 5/2011 | Sakamoto et al. |
| 2011/0116000 A1 | 5/2011 | Dunn et al. |
| 2011/0116231 A1* | 5/2011 | Dunn .............. H05K 5/0204 361/679.01 |
| 2011/0134356 A1 | 6/2011 | Swatt et al. |
| 2011/0141672 A1 | 6/2011 | Farley, Jr. et al. |
| 2011/0227467 A1 | 9/2011 | Foppe, Jr. et al. |
| 2011/0297810 A1 | 12/2011 | Tachibana |
| 2012/0019483 A1* | 1/2012 | Chiang .............. G06F 3/0428 345/175 |
| 2012/0050958 A1 | 3/2012 | Sanford et al. |
| 2012/0105424 A1 | 5/2012 | Lee et al. |
| 2012/0162878 A1 | 6/2012 | Fukuma et al. |
| 2012/0224116 A1 | 9/2012 | Barnes |
| 2012/0253672 A1 | 10/2012 | Hoshino et al. |
| 2012/0268686 A1 | 10/2012 | Lee et al. |
| 2013/0069588 A1 | 3/2013 | Oda et al. |
| 2013/0135804 A1* | 5/2013 | Takechi .............. H05K 5/0017 361/679.01 |
| 2013/0194749 A1* | 8/2013 | Choi .............. H05K 5/03 361/679.01 |
| 2013/0211583 A1 | 8/2013 | Borra |
| 2013/0270975 A1 | 10/2013 | Dunn et al. |
| 2013/0294039 A1 | 11/2013 | Chao |
| 2013/0300360 A1 | 11/2013 | Kobayashi et al. |
| 2013/0329363 A1 | 12/2013 | Dunn et al. |
| 2014/0044147 A1 | 2/2014 | Wyatt et al. |
| 2014/0055914 A1 | 2/2014 | Fournier |
| 2014/0208626 A1 | 7/2014 | Moon |
| 2015/0009627 A1 | 1/2015 | Dunn et al. |
| 2015/0066837 A1 | 3/2015 | Twarog et al. |
| 2015/0069832 A1 | 3/2015 | Yamane et al. |
| 2015/0211676 A1 | 7/2015 | Martin et al. |
| 2015/0264826 A1 | 9/2015 | Dunn et al. |
| 2016/0014910 A1 | 1/2016 | Campagna et al. |
| 2016/0121735 A1 | 5/2016 | Sugano |
| 2016/0192536 A1 | 6/2016 | Diaz |
| 2016/0242329 A1 | 8/2016 | DeMars |
| 2017/0040789 A1 | 2/2017 | Bonilla et al. |
| 2017/0074453 A1 | 3/2017 | Bowers et al. |
| 2017/0083043 A1 | 3/2017 | Bowers et al. |
| 2017/0231112 A1 | 8/2017 | Dunn et al. |
| 2017/0318921 A1 | 11/2017 | Gharabegian |
| 2017/0345346 A1 | 11/2017 | Hong et al. |
| 2018/0111495 A1 | 4/2018 | Kinomura |
| 2018/0210492 A1 | 7/2018 | Chen et al. |
| 2018/0272959 A1 | 9/2018 | Hornsby et al. |
| 2018/0315356 A1 | 11/2018 | Dunn et al. |
| 2018/0345809 A1 | 12/2018 | Derrien et al. |
| 2019/0056058 A1 | 2/2019 | Pell et al. |
| 2019/0059175 A1 | 2/2019 | Diaz |
| 2019/0089176 A1* | 3/2019 | Dunn .............. H05K 5/0017 |
| 2019/0147492 A1 | 5/2019 | Krylov |
| 2019/0196251 A1 | 6/2019 | Woo et al. |
| 2019/0239365 A1 | 8/2019 | Dunn et al. |
| 2019/0250651 A1 | 8/2019 | Liu et al. |
| 2019/0302854 A1* | 10/2019 | Wu .............. G06F 1/1643 |
| 2019/0335613 A1 | 10/2019 | Diaz |
| 2020/0037456 A1 | 1/2020 | Dunn |
| 2020/0150597 A1 | 5/2020 | Aghara et al. |
| 2020/0163234 A1 | 5/2020 | Dunn |
| 2020/0241612 A1 | 7/2020 | Moon et al. |
| 2020/0288585 A1 | 9/2020 | Dunn et al. |
| 2020/0366104 A1 | 11/2020 | Stanfield |
| 2020/0369169 A1 | 11/2020 | Mercer et al. |
| 2020/0383246 A1 | 12/2020 | Lee |
| 2020/0390004 A1 | 12/2020 | Whitehead et al. |
| 2021/0094437 A1 | 4/2021 | Tsubokura et al. |
| 2021/0168949 A1 | 6/2021 | Dunn et al. |
| 2021/0182919 A1 | 6/2021 | Wyckoff et al. |
| 2021/0304644 A1 | 9/2021 | Webster |
| 2022/0035198 A1 | 2/2022 | Dunn et al. |
| 2022/0073021 A1 | 3/2022 | Dunn et al. |
| 2022/0132681 A1* | 4/2022 | Dunn .............. H05K 5/03 |
| 2022/0295666 A1 | 9/2022 | Dunn et al. |
| 2022/0327968 A1 | 10/2022 | Wesley et al. |
| 2022/0394861 A1 | 12/2022 | Dunn et al. |
| 2023/0058547 A1 | 2/2023 | Dunn et al. |
| 2023/0287670 A1 | 9/2023 | Ethier |
| 2023/0333423 A1 | 10/2023 | Dunn et al. |
| 2023/0380079 A1 | 11/2023 | Dunn et al. |
| 2024/0027806 A1 | 1/2024 | Dunn et al. |
| 2024/0096246 A1 | 3/2024 | Dunn et al. |
| 2024/0096247 A1 | 3/2024 | Dunn et al. |
| 2024/0098919 A1 | 3/2024 | Dunn et al. |
| 2024/0276662 A1 | 8/2024 | Dunn et al. |

FOREIGN PATENT DOCUMENTS

| | | |
|---|---|---|
| AU | 2022202810 B2 | 11/2023 |
| CA | 2780884 C | 4/2019 |
| CA | 2942321 C | 6/2022 |
| CA | 3106866 C | 11/2023 |
| CA | 226764 | 11/2024 |
| CN | 206610564 U | 11/2017 |
| CN | 210864671 U * | 6/2020 |
| CN | 214171740 U | 9/2021 |
| EM | 015031795-0001 | 8/2023 |
| EM | 015031795-0002 | 8/2023 |
| EM | 015031795-0003 | 8/2023 |
| EM | 015031795-0004 | 8/2023 |
| EM | 015031795-0005 | 8/2023 |
| EM | 015031795-0006 | 8/2023 |
| EM | 015044249-0001 | 12/2023 |
| EP | 3468321 A1 | 4/2019 |
| EP | 3117693 B1 | 8/2019 |
| EP | 3468321 B1 | 4/2021 |
| EP | 3830464 A1 | 6/2021 |
| EP | 4232870 A1 | 8/2023 |
| GB | 153110 | 11/1920 |
| GB | 2483703 A | 3/2012 |
| GB | 6304834 | 8/2023 |
| GB | 6304835 | 8/2023 |
| GB | 6304836 | 8/2023 |
| GB | 6304837 | 8/2023 |
| GB | 6304838 | 8/2023 |
| GB | 6304839 | 8/2023 |
| GB | 6333108 | 12/2023 |
| JP | 2001-249402 A | 9/2001 |
| JP | 2005292939 A | 10/2005 |
| JP | 2005332253 A | 12/2005 |
| JP | 2006198344 A | 8/2006 |
| JP | 2009-44262 A | 2/2009 |
| KR | 200163508 Y1 | 7/2000 |
| KR | 200206768 Y1 | 12/2000 |
| KR | 200236278 Y1 | 10/2001 |
| KR | 2002-0057425 A | 7/2002 |
| KR | 200286961 Y1 | 8/2002 |
| KR | 200366674 Y1 | 11/2004 |
| KR | 10-2379046 B1 | 3/2022 |
| KR | 10-2512657 B1 | 3/2023 |
| WO | WO2011059793 A2 | 5/2011 |
| WO | WO2012006620 A2 | 1/2012 |
| WO | 2012/035362 A1 | 3/2012 |
| WO | 2014/122943 A1 | 8/2014 |
| WO | 2014/195560 A1 | 12/2014 |
| WO | 2015138609 A2 | 9/2015 |
| WO | 2016102980 A1 | 6/2016 |
| WO | 2018/185364 A1 | 10/2018 |
| WO | 2020028045 A1 | 2/2020 |

(56) References Cited

FOREIGN PATENT DOCUMENTS

| WO | 2022/087488 A1 | 4/2022 |
| WO | 2024/049953 A1 | 3/2024 |

OTHER PUBLICATIONS

The Free Dictionary, Screw Definition of screw by The Free Dictionary, Jun. 15, 2016, 1 Page.
I-Tech Company, 65" Outdoor Digital Signage Sunlight All Weather Proof LCD, 1 Page.
Sunlightlcd.com, 46" All Weather NEMA4 Outdoor High Brightness (Model: GS4600L), Mar. 11, 2009, 2 Pages.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017, 14 pages.
Adnation, Turn Key Advertising Technology Solutions, May 23, 2017, 4 pages.
Civiq Smartscapes, FlexVue Ferro 55P/55L, Mar. 16, 2017, 4 pages.
Civiq, Invalidity Contentions, Jan. 24, 2018, 51 pages.
Civiq, Invalidity Claim Chart, Appendix E, Jan. 24, 2018, 28 pages.
Civiq, Invalidity Claim Chart, Appendix I, Mar. 22, 2018, 4 pages.
Civiq, Smart City Devices, webpage, Jan. 30, 2019, 5 pages.
Civiq, Smart City Platform, webpage, Jan. 30, 2019, 10 pages.
Civiq, Smartscapes devices, webpage, Jan. 30, 2019, 1 page.
Miller, Adnation, photos, May 9, 2017, 28 pages.

\* cited by examiner

DISPLAY ASSEMBLY WITH REPLACEABLE COVER

CROSS-REFERENCE TO RELATED APPLICATIONS

This application is filed as original and therefore makes no priority claim.

TECHNICAL FIELD

Exemplary embodiments relate generally to display assemblies with replaceable covers as well as subassemblies, systems, and methods related to the same.

BACKGROUND AND SUMMARY OF THE INVENTION

Digital out of home ("DOOH") advertising is an increasingly popular field. These DOOH assemblies are sometimes used to show advertising and/or public announcements. Being typically installed in public places with relatively high population densities, these display assemblies have, unfortunately, sometimes been the target of vandals. Despite attempts to make the display assemblies vandalism resistant, vandals sometime succeed in scratching or breaking parts of the display assemblies, such as the covers. Additionally, being installed outside at a variety of locations, these display assemblies are often exposed to harsh and varied conditions. Despite attempts to make the display assemblies resistant to weather and other external conditions, sometimes parts of the display assemblies, such as the covers, become damaged by other external events or conditions (e.g., weather, vehicle collisions). Regardless of the cause, the covers of such display assemblies sometimes become damaged and/or otherwise need replaced. Replacing the cover can be resource intensive efforts and may include blocking off areas around the display assemblies, transporting a new cover to the display assemblies, removing the old cover, and installing the new cover. Sometimes, this effort requires replacing a whole electronic display or subassembly thereof.

What is needed is a display assembly with a replaceable cover. Display assemblies with replaceable covers are disclosed, along with related subassemblies, systems, and methods. A door subassembly includes a door frame. Clips are removably attachable to the door frame, such as by way of threaded fasteners and nuts. The door frame may be rectangular in shape. The clips may be provided on a one-to-one basis with sides of the door frame. The clips may collectively surround an outer perimeter of the door frame. For example, one clip may be provided for each of four sides of the rectangular shaped door frame. Vents may be provided in the clips to align with vents of the door frame, such as at top and bottom clips and side of the door frame. Each clip may include a fascia and a stud. The stud may be adhered, welded, bonded, or otherwise permanently attached to an interior surface of the fascia. The stud may add strength and/or rigidity to the clip. The fascia may include a lip which extends over at least part of a front surface of the cover. The fasteners may extend from a space between the stud and the fascia through an aperture of the stud and an aligned aperture in the door frame where the nut is installed, thereby connecting the clips to the door frame.

The door frame may include a ledge for receiving a portion of a rear surface of the cover. The ledge of the door frame and lip of clips may sandwich the cover, thereby securing the cover, at least in part.

Where a cover of a display assembly (sometimes also referred to herein as a "unit") is damaged or otherwise in need of replacement, a display subassembly of the unit, which may include the cover subassembly, may be moved away from a structural framework of the unit to which the display subassembly is movably connected (e.g., hinged). The nuts may be backed off the threaded fasteners so that the clips and cover (or what remains thereof) may be removed.

A replacement cover may be installed locally, such as by removing the clips and existing cover or remainder thereof. However, more preferably (but optionally), a replacement cover subassembly (e.g., with at least the new replacement cover as well as a replacement door frame and/or clips) is installed, either with a new set of nuts and/or fasteners or reusing some or all of the nuts and/or fasteners. Where the replacement cover subassembly is installed, the removed cover subassembly may be transported offsite where a new cover is installed. This allows refurbishment of the cover subassembly (e.g., at least the door frame and/or clips), such as for subsequent reuse. This may minimize time needed onsite. This may also permit a replacement cover subassembly essentially be on standby to service a relatively large number of units. The clips may, alternatively or additionally, enhance strength.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical, similar, or equivalent features, and wherein.

DETAILED DESCRIPTION OF EXEMPLARY EMBODIMENT(S)

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Figure 1:
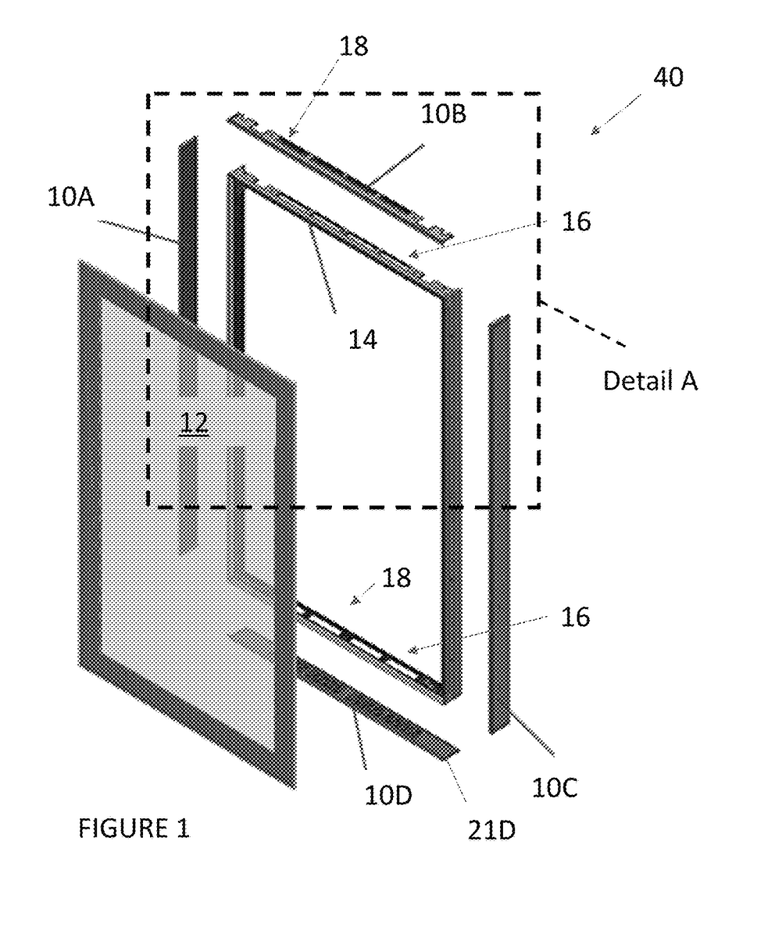
FIG. 1 is an exploded, perspective view of an exemplary replaceable cover subassembly.
Figure 2:
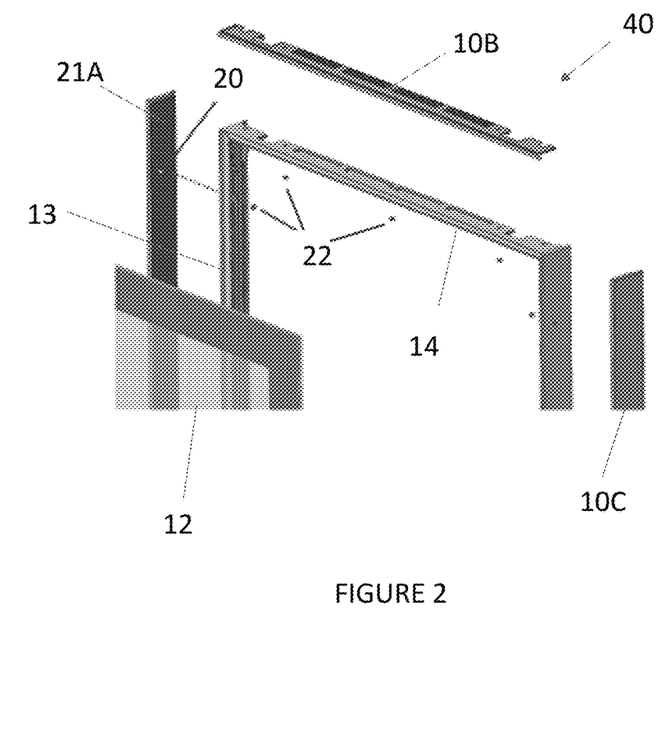
FIG. 2 is a detailed, exploded perspective view of the replaceable cover subassembly of detail A of FIG. 1.

FIG. 1 and FIG. 2 illustrate an exemplary cover subassembly 40. The cover subassembly 40 may comprise a door frame 14. The door frame 14 may be configured to accommodate a cover 12. For example, without limitation, the door frame 14 may be sized and/or shaped to accommodate the cover 12. The cover 12 may comprise a single layer or multiple layers. The cover 12 layer(s) may comprise glass, one or more polymers (e.g., acrylic), polarizer(s), anti-reflective films, combinations thereof, or the like. In exemplary embodiments, without limitation, the frame 14 includes a ledge 13 around an inner perimeter thereof which receives a portion of a bottom surface of the cover 12. The cover 12 may be transparent or translucent over at least a majority of a surface area thereof, such as to allow viewing therethrough.

The cover subassembly 40 may comprise a number of clips 10. In this way, each of the clips 10A-10D may include a lip 11A-11D, by way of example. In exemplary embodiments, without limitation, one of the clips 10 is provided for each side of the door frame 14. For example, without limitation, the door frame 14 may be generally rectangular in shape with four clips 10A, 10B, 10C, and 10D provided for the top, bottom, left side, and right side thereof. In this way, a perimeter of the door frame 14 may be surrounded by the clips 10.

Some, preferably (but optionally) all, of the clips 10 may extend along a side of the door frame 14 and may comprise a lip 11. The lips 11 may extend over a portion of a front surface of the cover 12. In this way, the cover 12 may be secured from forward movement. The cover 12 may be secured from rearward movement by the ledge 13 of the door frame 14. In this way, a portion of the cover 12 may be sandwiched between the ledge 13 and the lip 11. Optionally, adhesive may be provided at the forward and/or rearward surface of the cover 12 to additionally secure it to the lip 11 and/or ledge 13.

Some, preferably (but optionally) all, of the clips 10 may comprise a stud 20. The stud 20 may serve to strengthen the clips 10. The stud 20 may comprise a planar or substantially (e.g., within 90%) planar object. The stud 20 may extend along an interior facing portion of a fascia 21 of the clips 10. Preferably, the studs 20 each extend over at least a majority of the interior surface of the fascia 21, though such is not required. Each of the clips 10A-10D may include a fascia 21A-21D in exemplary embodiment.

The fascia 21, for example without limitation, may be painted, textured, or the like. The studs 20 may be adhered, welded, bonded, or otherwise permanently attached to an interior surface of the fascia 21 though such is not required. Alternatively, the studs 20 may be integrally formed with the fascia 21. Alternatively still, the studs 20 may be secured to the fascia 21 by fasteners and/or nuts 22.

A space may be provided between at least portions of the stud 20 and the fascia 21, such as to accommodate a least a portion of the fasteners. The fasteners may comprise threaded shafts, such as in the form of bolts, by way of non-limiting example.

The studs 20 may comprise apertures, such as for receiving the fasteners. For example, without limitation, the apertures in the studs 20 may be threaded to receive the threaded shafts of the fasteners. The apertures may be aligned with apertures in the door frame 14.

As another example, without limitation, the fasteners may be integrally formed with or permanently attached to the studs 20 and/or fascia 21. In such embodiments, the fasteners may be aligned with the apertures in the door frame 14.

In exemplary embodiments, without limitation, the fasteners may be extended from between the fascia 21 and studs 20 through the aperture therein and through the aperture in the door frame 14 and may be secured by a nut 22. In this way, the clips 10 may be secured to the door frame 14. In other exemplary embodiments, without limitation, the fasteners may be extended through the aperture in the door frame 14 and may be secured by a nut 22, thereby securing the clips 10 to the door frame 14.

Multiple apertures, fasteners, and/or nuts 22 may be provided for each of the clips 10.

Some of the clips 10 may comprise exterior vents 18. The exterior vents 18 may be aligned with interior vents 16 in the door frame 14, such as to allow airflow into the display assemblies 60. In exemplary embodiments, without limitation, such exterior vents 18 are provided at top and bottom clips 10B, 10D, such as to align with top and bottom interior vents 16 in the door frame 14. Other location and/or number of vents 16, 18 may be utilized. The vents 16, 18 may be part of and/or provide access to one or more airflow pathways of the display assembly 60.

Figure 3:
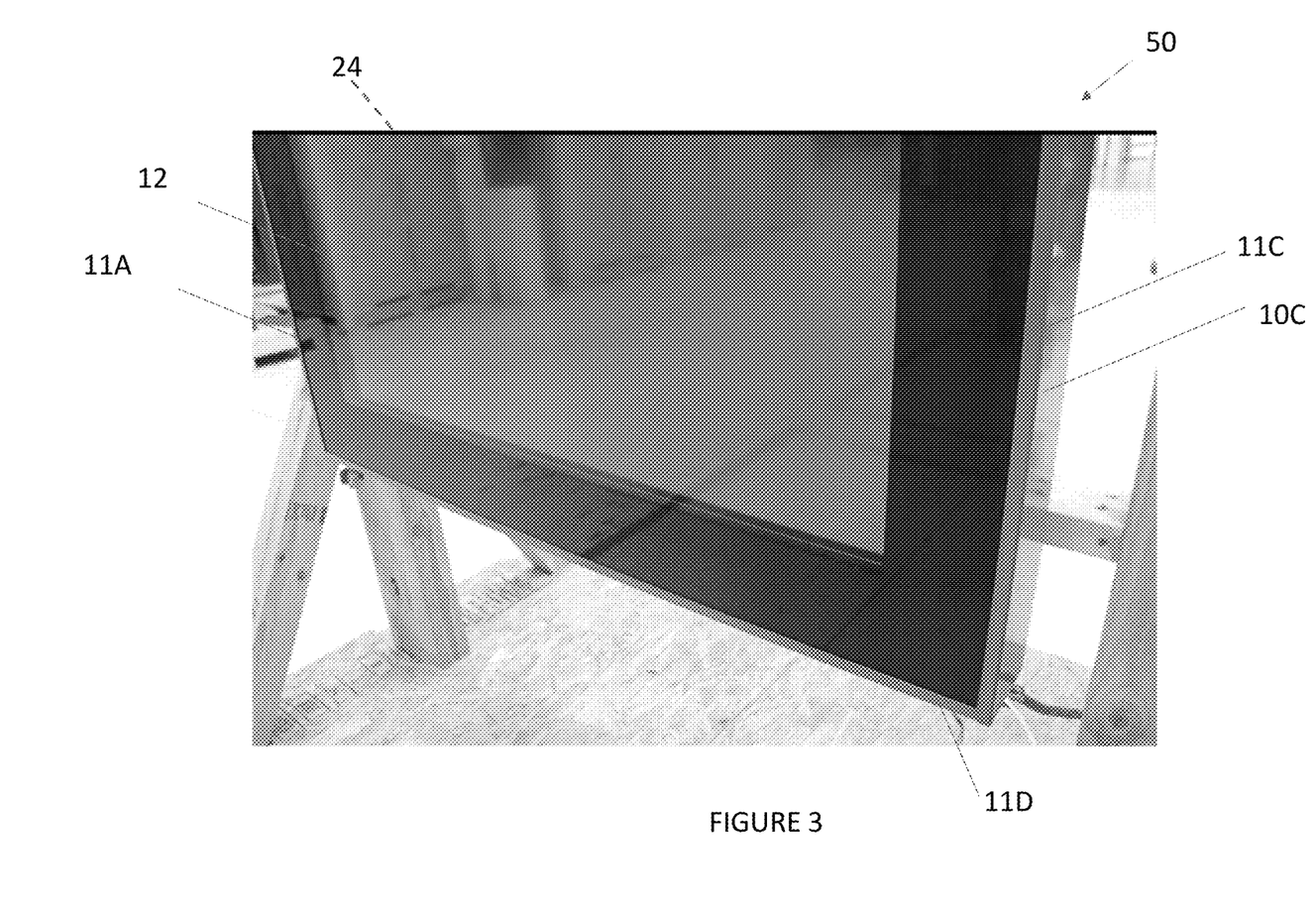
FIG. 3 is a detailed, perspective view of an exemplary display subassembly with the replaceable cover subassembly of FIGS. 1-2.
Figure 4:
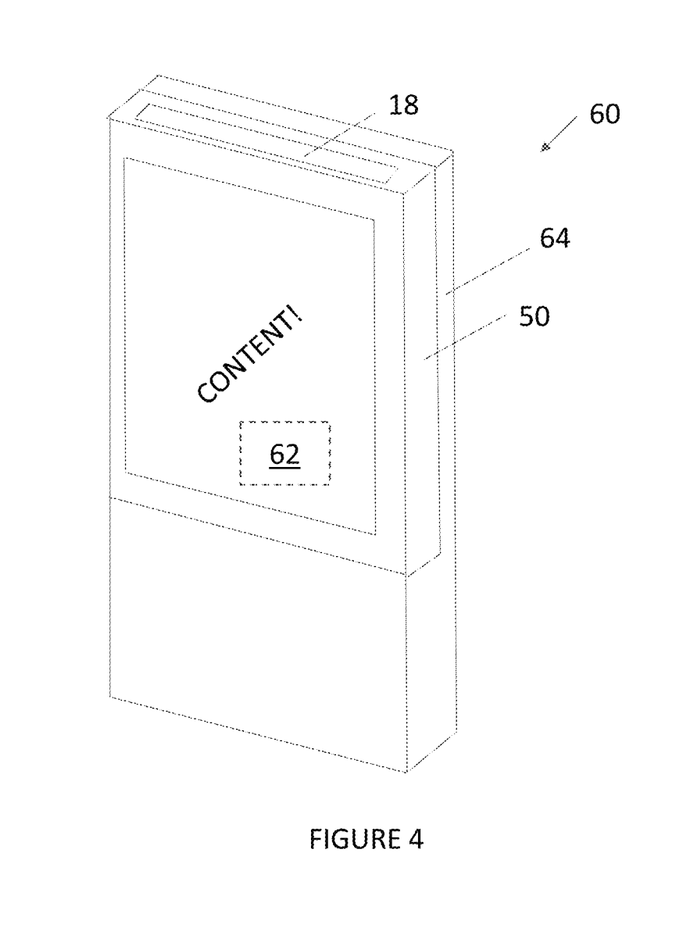
FIG. 4 is a perspective view of an exemplary display assembly with the replaceable cover subassembly of FIGS. 1-2 and/or display subassembly of FIG. 3.

As illustrated with particular regard to FIG. 3 and FIG. 4, the cover subassembly 40 may be part of a display subassembly 50, which may include at least one electronic display 24. The electronic display 24 may be located rearwards, and optionally (but preferably) spaced apart from, the cover 12. The electronic display 24 may comprise a liquid crystal type display, though other types of displays may be utilized, such as but not limited to, organic light emitting diode, light emitting diode, plasma, combinations thereof, or the like. The electronic display 24 may optionally be touch sensitive.

The electronic display 24 in exemplary embodiments, without limitation, may comprise a liquid crystal layer and a backlight (preferably direct, but optionally edge lit). The electronic display 24 may include more polarizers, anti-reflective films, optical layers or coatings, combinations thereof, or the like.

The display assemblies 60 may include one or more open airflow pathways. The open airflow pathways may be open to an ambient environment, such as by way of the vents 16, 18. Alternatively, or additionally, the display assemblies 60 may comprise one or more closed airflow pathways. The closed airflow pathways may be separated from the ambient environment and/or the open airflow pathways. The closed airflow pathway(s) may each comprise one or more spaces, channels, combinations thereof, or the like within the display assemblies 60.

The closed airflow pathway(s) may be separated from ambient and/or the open airflow pathway(s), such as in accordance with at least ingress protection (IP) code 55 or higher available from the International Electrotechnical Commission of Geneva Switzerland. E.g., https://www.iec.ch/ip-ratings. More preferably, but optionally, such separation may be in accordance with at least IP 65 or higher.

The open and closed airflow pathway(s) may extend adjacent to one another to transfer heat. In exemplary embodiments, without limitation, heat exchangers or the like may be provided to enhance such transfer while maintaining the aforementioned separation.

The display assemblies 60 may comprise one or more internal components 62. The internal components 62 may include one or more of: fans, video players, sensors (e.g., temperature, pressure, humidity, location/GPS, light (e.g., ambient light, display 24 illumination), combinations thereof, or the like), controllers for the same, network connectivity device (e.g., routers, modems, antenna, combinations thereof, or the like), VOIP equipment, emergency calling equipment, heat exchangers, thermal devices (e.g., thermoelectric coolers, air conditioners, heaters), electrical equipment (e.g., batteries, power supplies, transformers, circuit breakers, combinations thereof, or the like), cameras, lights, microphones, combinations thereof, or the like. The internal components 62 may support operation of the display assembly 60 and/or display subassemblies 50. The illustrated location, number, size, shape, and/or the like of the internal components 62 is not intended to be limiting. The internal components 62 may be part of the display subassembly 50 and/or the unit 60.

A single one of, or multiple, of the display subassemblies 50 may be provided at a given display assembly 60. For example, without limitation, two of the display subassemblies 50 may be provided in a back-to-back type arrangement at the display assembly 60. The display assembly 60 may comprise a structural framework 64 (e.g., one or more members) arranged to support the display subassemblies 50. The display subassemblies 50 may be movably connected to the structural framework 64, such as, but not limited to, in a hinged arrangement. The structural framework 64 may be configured for mounting at or to a ground surface (e.g., a city sidewalk), a vehicle, an item of street furniture (e.g., bus shelter, phone booth, utility box, utility pole, newspaper stand, poster display, former and/or retrofitted versions thereof, combinations thereof, or the like), a wall, combinations thereof, or the like.

Figure 5:
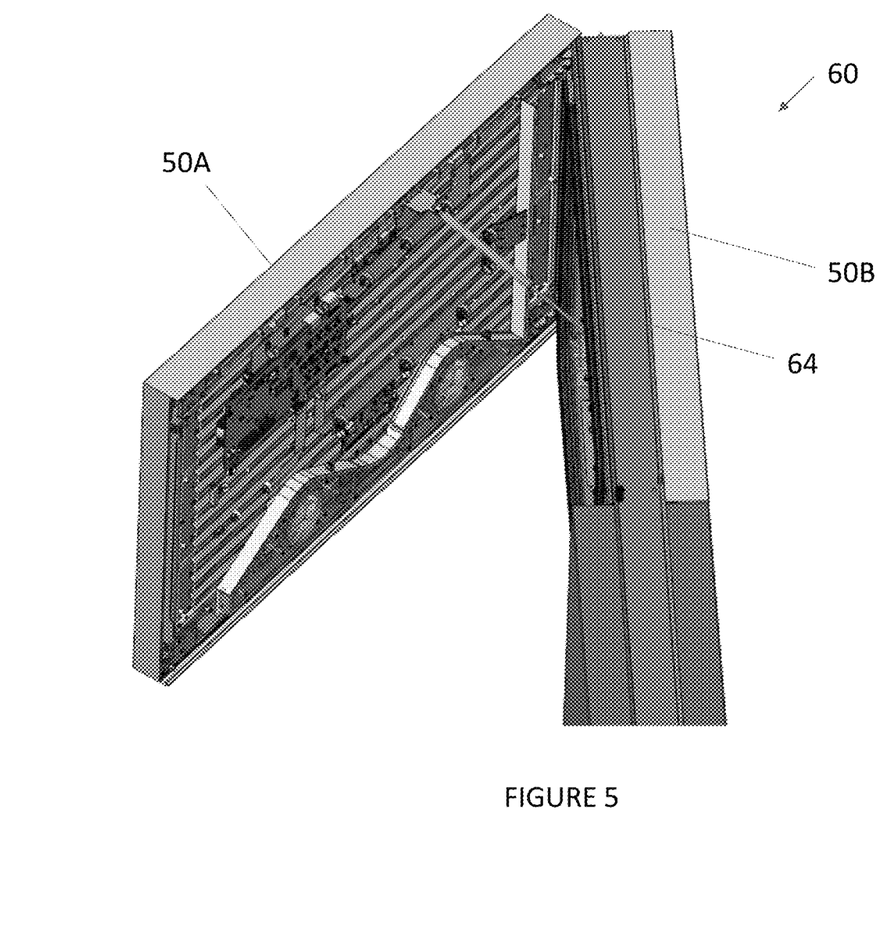
FIG. 5 is a bottom perspective view of another exemplary display assembly with the replaceable cover subassembly of FIGS. 1-2 with the display subassembly, such as of FIG. 3, in an open position.

FIG. 5 illustrates the display assembly 60 with the display subassembly 50 moved into an open position, such as where a bottom and/or bottom portion of the display subassembly 50 is moved away from the structural framework 64. As illustrated, the display assembly 60 may include multiple display subassemblies 50A, 50B, such as attached to opposing sides of the structural framework 64.

Figure 6:
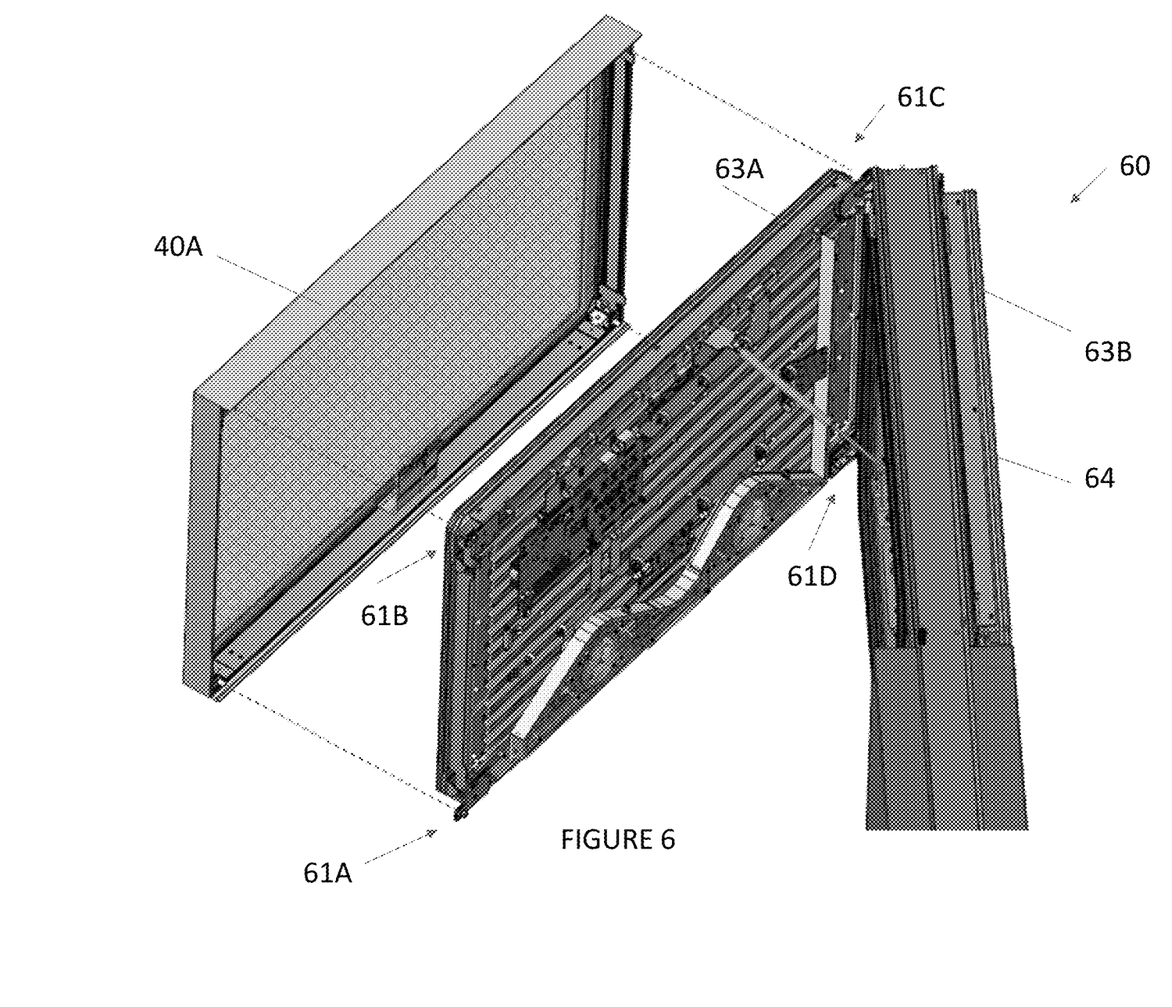
FIG. 6 is the bottom perspective view of the display assembly of FIG. 5 with the door subassembly removed.

FIG. 6 illustrates the display assembly 60 with the cover subassemblies 40 removed. The second cover subassembly 40B is not illustrated, while the first cover subassembly 40A is illustrated in an exploded view. A remainder 63A, 63B of the display subassemblies 50A, 50B may remain attached to the structural framework 64. The remainder 63 of the display subassembly 50 may comprise a frame, one or more members, one or more panels, the electronic display 24, some or all of the internal components 62, combinations thereof, or the like.

The display subassemblies 50 may be connected to the structural framework 64 by way of one or more hinges, members, gas struts, combinations thereof, or the like to facilitate movement between an opened position (away, at least in part, from the structural framework 64) and a closed position (against the structural framework 64).

In exemplary embodiments, without limitation, the cover subassemblies 40 may be removed by removing associated fasteners, such as four nuts and/or threaded fasteners (e.g., bolts) generally indicated at items 61A, 61B, 61C, and 61D.

Figure 7:
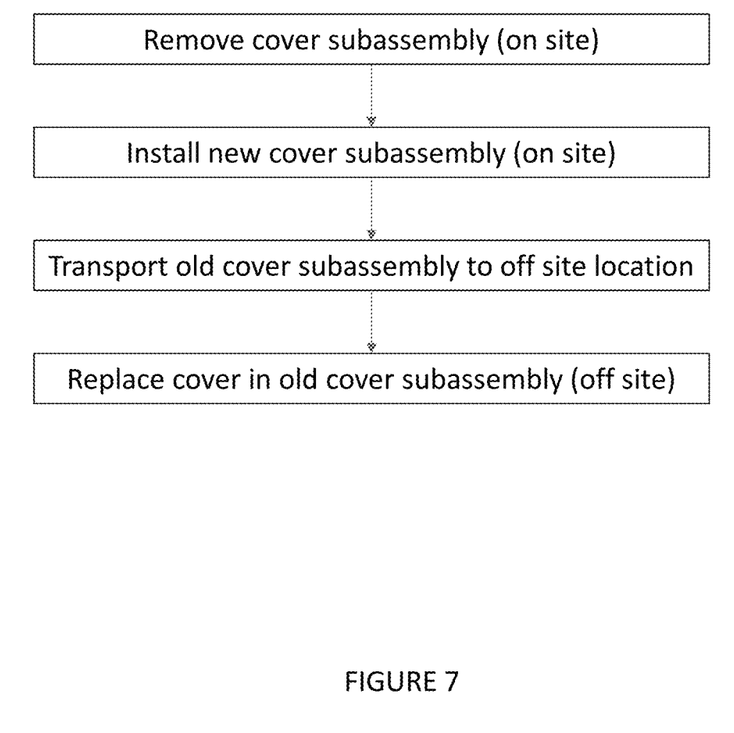
FIG. 7 is a flow chart with an exemplary method of replacing the replaceable cover subassembly of FIGS. 1-2 at the display subassembly of FIG. 3 and/or the display assembly of FIGS. 4-6.

FIG. 7 provides an exemplary method of replacing one of the cover subassemblies 40 at a given display assembly 60. If a cover subassembly 40 needs replaced, such as due to vandalism and/or environmental damage by way of non-limiting example, a technician or crew may be dispatched to a location where the display assembly 60 is installed. The cover subassembly 40 may be removed. The cover subassembly 40 may be attached at one or more hinge points, such as by way of one or more pins, bolts, nuts, and/or other fasteners in exemplary embodiments without limitation.

In other exemplary embodiments, without limitation, the display subassembly 50 may be moved away from the structural framework 64 to access the nuts 22 and/or fasteners. The nuts 22 and/or fasteners may be removed so the clips 10 and cover 12 may be removed from, or with, the door frame 14.

A new cover subassembly 40 may be installed, such as by installing a new cover 12 and clips 10, and optionally door frame 14, including threading the nuts 22 (same or new) to the fasteners thereof, or vice-versa. The display subassembly 50 may be closed. The damaged/removed cover subassembly 40 may be transported off site, where a new cover 12 may be installed.

In this way, a user (e.g., customer, service provider) may purchase or otherwise be provided with an extra cover subassembly 40 (e.g., door frame 14 and/or clips 10) and one or more extra covers 12 and easily and efficiently replace any damaged covers 12. The damaged/removed cover subassembly 40 may be reconditioned off site (e.g., new cover 12 installed) so that the damaged/removed cover subassembly 40 is ready for reuse. This may limit time on site and need to replace an entire display subassembly 50, by way of non-limiting example.

A new set of nuts 22 and/or fasteners may be used with installation at a display assembly 60, and/or some of all of the nuts 22 and/or fasteners may be kept and reused at the display assembly 60.

While nuts 22 and threaded fasteners are sometimes shown and/or discussed, other types of fastening arrangements and components may be utilized, such as but not necessarily limited to, pins, bolts, mating protrusions and recesses, friction fits, combinations thereof, or the like.

Figure 8:
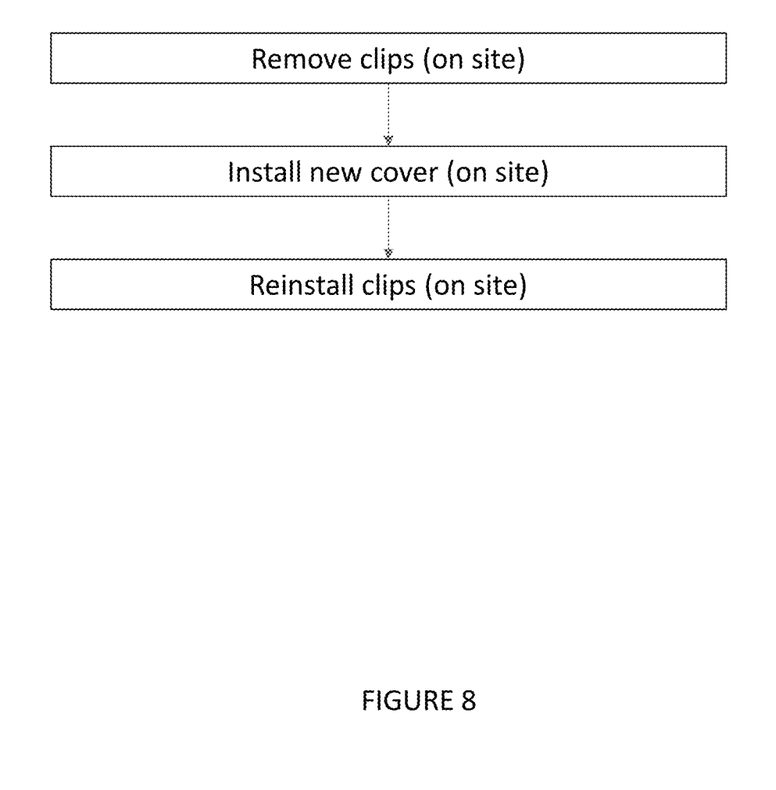
FIG. 8 is a flow chart with another exemplary method of replacing the replaceable cover subassembly of FIGS. 1-2 at the display subassembly of FIG. 3 and/or the display assembly of FIGS. 4-6.

In other exemplary embodiments, such as illustrated with particular regard to FIG. 8 by way of non-limiting example, the cover subassembly 40 may be reused onsite, without the exception of the cover 12. For example, without limitation, the clips 10 may be removed onsite and a new cover 12 installed with the new clips 10.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention.

Certain operations described herein may be performed by one or more electronic devices. Each electronic device may comprise one or more processors, electronic storage devices, executable software instructions, combinations thereof, and the like configured to perform the operations described herein. The features and/or functionality shown and/or described herein may be accomplished by way of stored, executable software instructions, such as in the form of applications, programs, routines, combinations thereof, or the like. The electronic devices may be general purpose computers or specialized computing devices. The electronic devices may comprise personal computers, smartphones, tablets, databases, servers, or the like. The electronic connections and transmissions described herein may be accomplished by one or more wired or wireless connectivity components (e.g., routers, modems, ethernet cables, fiber optic cable, telephone cables, signal repeaters, and the like) and/or networks (e.g., internets, intranets, cellular networks, the world wide web, local area networks, and the like). The computerized hardware, software, components, systems, steps, methods, and/or processes described herein may serve to improve the speed of the computerized hardware, software, systems, steps, methods, and/or processes described herein. The electronic devices, including but not necessarily limited to the electronic storage devices, databases, controllers, or the like, may comprise and/or be configured to hold, solely non-transitory signals.

What is claimed is:

1. A system for replacing covers of display assemblies, said system comprising:
   one or more display assemblies, each comprising:
   a structural framework; and
   a display subassembly moveably connected to said structural framework and comprising an electronic display and a cover subassembly comprising:
   a door frame having outer side surfaces defining a side perimeter of the door frame and a ledge extending along an inner perimeter of the door frame;
   a plurality of clips, each having a fascia extending along, and covering, one of the outer side surfaces of the door frame after installed and a lip, wherein each of the clips is removably and separately installed in an individually replaceable fashion to a respective one of the outer side surfaces of said door frame by fasteners, and wherein said lip extends towards inner perimeter of the door frame after installed; and
   a cover, a portion of a perimeter of which is sandwiched between the ledge of said door frame and the lip of each of said clips to hold said cover in place;
   wherein the cover is positioned forward of the electronic display and is directly contacted by, and held at least in part by, the lip of said clips; and
   at least one spare one of the cover subassembly, wherein the at least one spare cover subassembly is interchangeably installable to any of the one or more display assemblies.

2. A display assembly with replaceable covers, said display assembly comprising:
   a structural framework;
   a display subassembly moveably connected to said structural framework and comprising an electronic display and a cover subassembly comprising:
   a door frame having outer side surfaces defining a side perimeter of the door frame and a ledge extending along an inner perimeter of the door frame;
   a plurality of clips, each having a fascia extending along, and covering, one of the outer side surfaces of the door frame once installed and a lip, wherein each of the clips is removably and separately installed in an individually replaceable fashion to a respective one of the outer side surfaces of said door frame by fasteners, and wherein said lip extends towards inner perimeter of the door frame after installed; and
   a cover, a portion of a perimeter of which is sandwiched between the ledge of said door frame and the lip of each of said clips to hold said cover in place,
   wherein the cover is positioned forward of the electronic display and is directly contacted by, and held at least in part by, the lip of said clips.

3. The display assembly of claim 2 wherein:
   the door frame forms a rectangular shape; and
   four of the clips are provided, one for each side of the door frame.

4. The display assembly of claim 3 further comprising:
   exterior vents provided at a top one and a bottom one of the four clips; and
   interior vents provided at a top side and a bottom side of the door frame.

5. The display assembly of claim 3 wherein:
   the ledge is provided at each side of the inner perimeter of the door frame; and
   the clips collectively cover the outer side surfaces of the door frame, after installed.

6. The display assembly of claim 2 wherein:
   each of the fasteners comprise a threaded shaft; and
   the fasteners are secured to the door frame by nuts.

7. The display assembly of claim 6 wherein:
   each of the clips comprise a stud located interior to the fascia;
   each side of the door frame comprises apertures;
   each of the fasteners extend from the stud of a respective one of the clips, through a respective one of the apertures of the door frame; and
   the nuts are threaded to a portion of the threaded shafts extending through the apertures of the door frame.

8. The display assembly of claim 2 wherein:
   the electronic display comprises a directly backlit liquid crystal display.

9. The display assembly of claim 2 wherein:
   the electronic display is spaced apart from the cover.

10. The display assembly of claim 2 wherein:
    the cover subassembly is removably connected to a remainder of the display subassembly.

11. The display assembly of claim 2 further comprising:
    at least one open airflow pathway; and
    at least one closed airflow pathway.

12. The display assembly of claim 11 wherein:
    at least a portion of the open airflow pathway extends through the display subassembly; and
    at least a portion of the closed airflow pathway extends through the display subassembly, including in front of and behind the electronic display.

13. The display assembly of claim 2 wherein:
    an edge of the lip is connected to, and extends transverse from, an edge of the fascia of a respective one of the clips, thereby forming a corner.

14. The display assembly of claim 13 wherein:
    the ledge is connected to, and extends transverse from, an inward facing surface of an associated one of the outer side surfaces of the door frame.

15. The display assembly of claim 14 wherein:
    the ledge, which extends directly from the inner perimeter, is recessed from each of an upper and lower edge of the outer side surfaces of the door frame.

16. The display assembly of claim 2 wherein:
a bottom surface of the cover contacts the ledge of the door frame; and
an upper surface of the cover contacts the lip of each of the clips, after installed.

17. The display assembly of claim 16 wherein:
the cover comprises glass or a polymer.

18. The display assembly of claim 17 wherein:
the cover comprises multiple layers.

19. The display assembly of claim 18 wherein:
at least one of the layers comprises a polarizer.

\* \* \* \* \*